(12) United States Patent
Kinoshita et al.

(10) Patent No.: US 6,511,908 B2
(45) Date of Patent: Jan. 28, 2003

(54) METHOD OF MANUFACTURING A DUAL DAMASCENE STRUCTURE USING BORON NITRIDE AS TRENCH ETCHING STOP FILM

(75) Inventors: Takao Kinoshita, Osaka (JP); Kunihiko Orita, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/886,467

(22) Filed: Jun. 22, 2001

(65) Prior Publication Data

US 2002/0001939 A1 Jan. 3, 2002

(30) Foreign Application Priority Data

Jun. 27, 2000 (JP) .......................... 2000-193001

(51) Int. Cl.$^7$ .......................... H01L 21/4763
(52) U.S. Cl. .................. 438/637; 438/622; 438/634; 438/700; 438/675; 438/672
(58) Field of Search ................ 438/622, 624, 438/632, 634, 637, 720, 633, 690–693, 700, 675, 672

(56) References Cited

U.S. PATENT DOCUMENTS

| | | | |
|---|---|---|---|
| 5,272,117 A | * 12/1993 | Roth et al. | 437/228 |
| 5,641,974 A | 6/1997 | den Boer et al. | |
| 6,069,069 A | * 5/2000 | Chooi et al. | 438/634 |
| 6,165,891 A | * 12/2000 | Chooi et al. | 438/622 |
| 6,194,321 B1 | * 2/2001 | Moore et al. | 438/706 |
| 6,376,270 B1 | 4/2002 | Gu et al. | |

FOREIGN PATENT DOCUMENTS

JP          7-283312          10/1995

\* cited by examiner

Primary Examiner—Carl Whitehead, Jr.
Assistant Examiner—Khanh Duong
(74) Attorney, Agent, or Firm—Nixon & Vanderhye P.C.

(57) ABSTRACT

A method of manufacturing a semiconductor device comprising a wiring formation step including: forming an interlayer insulating film composed of a boron nitride film having a dielectric constant of less than 4 on an (n)-th layer wiring, forming a hole and/or a trench in the interlayer insulating film, burying the hole and/or trench with a conductive material and forming an (n+1)-th layer wiring on the hole and/or trench.

11 Claims, 2 Drawing Sheets

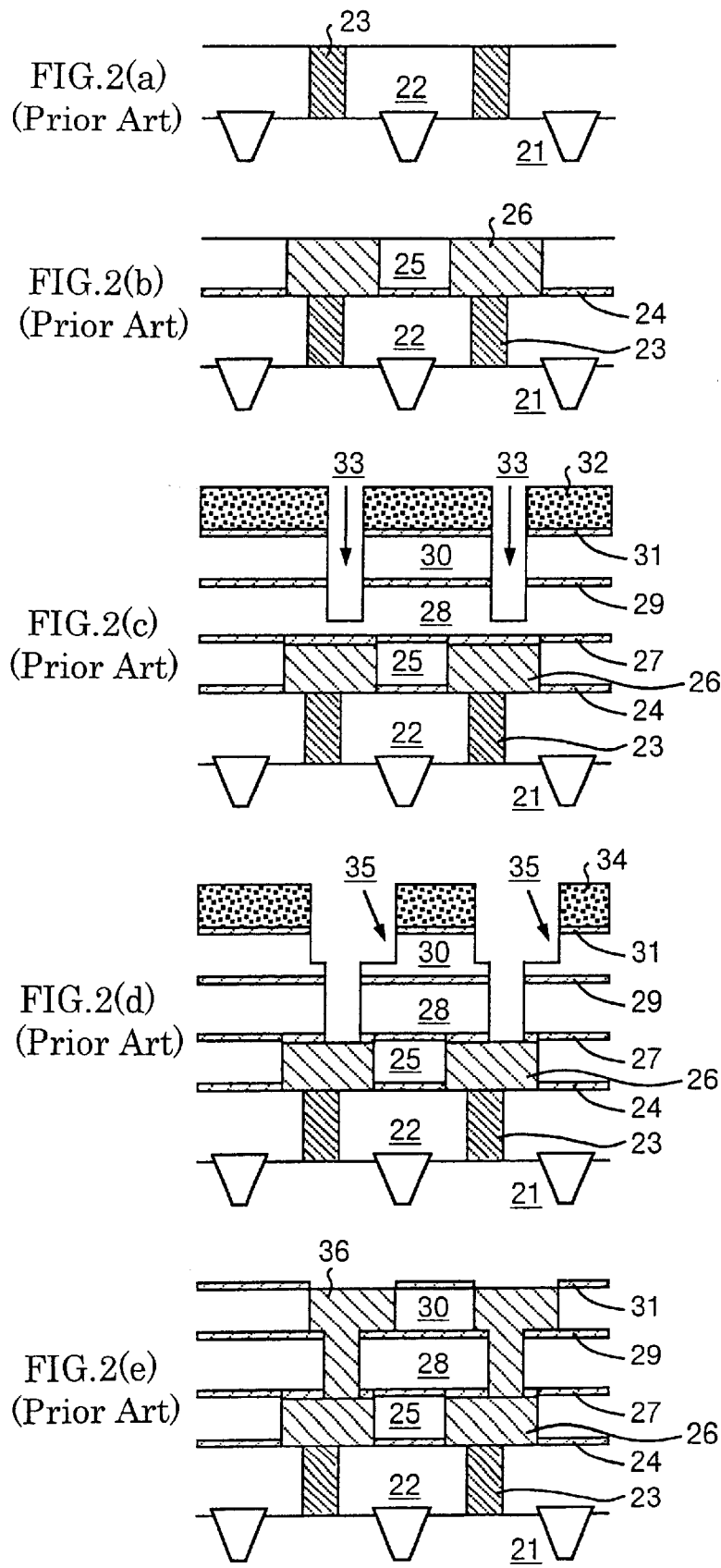

METHOD OF MANUFACTURING A DUAL DAMASCENE STRUCTURE USING BORON NITRIDE AS TRENCH ETCHING STOP FILM

CROSS-REFERENCE TO RELATED APPLICATION

This application is related to Japanese application No. 2000-193001 filed on Jun. 27, 2000, whose priority is claimed under 35 USC §119, the disclosure of which is incorporated by reference in its entirety.

BACKGROUND OF THE INVENTION

1. Field of the Invention

The present invention relates to a method of manufacturing semiconductor devices. In particular it relates to a method of manufacturing semiconductor devices having a dual damascene structure wiring.

2. Description of Related Art

As a result of the recent scale down of wiring with the scale down of the semiconductor devices, the wiring resistance and wiring capacitance have increased so much that wiring delay represented by RC can not be neglected against the operating rate of LSI. Further, together with the scale down of wiring, the current density of the wiring has also increased, which gives rise its serious problems of fall of credibility of the wiring due to electromigration and rise of power consumption due to increase of the wiring capacitance.

So, copper, which is less resistant and shows higher electromigration tolerance than aluminum, has come into use as wiring material.

However, because the patterning of copper by a conventional dry etching technology is difficult, a damascene method using CMP method has been adapted. In particular, a dual damascene method, in which wiring trenches and contact holes are made simultaneously, has recently been developed.

Hereinafter a general dual damascene method will be explained.

At first, as shown in FIG. 2(a), an interlayer insulating film 22 made of BPSG (boron-phosphorus-silicate glass) is formed on a semiconductor substrate 21 having a transistor (not shown) formed thereon. A contact hole is formed in this interlayer insulating film 22. On the interlayer insulating film 22 including the contact hole, a tungsten film is formed and its surface is polished by a CMP method so that a tungsten plug 23 is buried in the contact hole.

Then, as shown in FIG. 2(b), an etching stop film 24 is deposited and a non-fluorinated organic polymer film 25 having a dielectric constant of 3.0 is formed thereon. In this non-fluorinated organic polymer film 25, a trench is formed for a damascene wiring structure, and copper is buried in the damascene wiring trench to form a first layer copper wiring 26.

Subsequently, as shown in FIG. 2(c), a copper diffusion inhibiting film 27 is formed by a plasma CVD method on the non-fluorinated organic polymer film 25 and the first layer copper wiring 26, and thereon are formed a non-fluorinated organic polymer film 28, a copper diffusion inhibiting film 29, a non-fluorinated organic polymer film 30 and an etching stop film 31. Then, a contact hole 33 for connecting the first copper wiring 26 and the second wiring is formed by dry etching using a resist mask 32 having a predetermined shape.

As shown in FIG. 2(d), a wiring trench 35 is formed by dry etching using a resist mask 34 having a predetermined shape so as to include the contact hole 33.

As shown in FIG. 2(e), copper is buried in the contact hole 33 and the wiring trench 35 to form a copper dual damascene wiring 36.

According to this dual damascene method, it is necessary to use the etching stop films in order to control the depth of the wiring trenches in dry etching for forming the wiring trenches in the interlayer insulating films because the depth of the trenches directly affects the wiring resistivity. Further, the copper diffusion inhibiting films are also needed for preventing copper from diffusing in the interlayer insulating films after forming the wiring because copper easily diffuses in the interlayer insulating film even by thermal treatment at low temperatures.

In general, a SiN film is used as an etching stop insulating film because it is easy to attain the selectivity in dry etching in comparison with insulating films such as silicon dioxide ($SiO_2$) film or fluorinated silicon dioxide (FSG) film. Further, the SiN film is also used as the copper diffusion inhibiting film because of having the function of inhibiting the copper diffusion.

However, because the SiN film shows a high dielectric constant of not less than 7, it is difficult to lower the wiring capacitance effectively by using the SiN film generally formed in the above method even if it is used in combination with a film of a low dielectric material (e.g. film having a dielectric constant of not more than 3.0) as an interlayer insulating film in the multilayer wiring structure. Here, the wiring capacitance means the capacitance which is generated between wirings arranged in a vertical direction or in a horizontal direction.

On the other hand, it is possible for lowering the wiring capacitance not to use the SiN film which has been used as an etching stop film at the time of forming the dual damascene structure wiring. In this case, however, there brings about other problems that it is difficult to control the depth of the wiring trenches, and that the shape of the contact holes may vary widely depending upon uniformity within plane of dry etching, and as a result, that the resistivity of the dual damascene wiring structure becomes unstable.

Further, the use of a boron nitride (BN) film as an etching stop film is described, for example, in Japanese Patent Laid-open H7(1995)-283312. However, since only relatively higher dielectric constant of about 4 is attained by a conventional BN film forming process, for example, by a plasma CVD method using $B_2H_6$ and $N_2$ as materials at temperature of about 350° C. in a 300 W plasma atmosphere, no sufficient fall in both the wiring capacitance in the vertical direction and in the horizontal direction is attained yet.

Moreover, the method of depositing the BN film as described above can provides only a deposition rate of 9 nm/min or less. That gives rise to problems such as prolonged manufacturing process and elevation of the manufacturing cost.

SUMMARY OF THE INVENTION

The present invention has been achieved in view of the above-described problems. An object of the present invention is to provide a method of manufacturing a semiconductor device which can realize a decreased wiring capacitance in the vertical direction and in the horizontal direction by forming an interlayer insulating film of low dielectric constant and realize high speed operation by a simple method.

According to the present invention, there is provided a method of manufacturing a semiconductor device comprising a wiring formation step including: forming an interlayer insulating film composed of a boron nitride film having a dielectric constant of less than 4 on an (n)-th layer wiring, forming a hole and/or a trench in the interlayer insulating film, burying the hole and/or trench with a conductive material and forming an (n+1)-th layer wiring on the hole and/or trench.

BRIEF DESCRIPTION OF THE DRAWINGS

FIGS. 2(a) to 2(e) are schematic sectional views of a major part for illustrating process of manufacturing a semiconductor device according to the prior art.

DESCRIPTION OF THE PREFERRED EMBODIMENTS

Figure 1A:
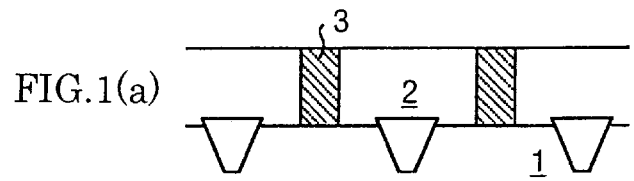
FIGS. 1(a) to 1(e) are schematic sectional views of a major part for illustrating an embodiment of a process of manufacturing a semiconductor device according to the present invention.

In the method of manufacturing semiconductor devices according to the present invention, an interlayer insulating film is generally formed on a semiconductor substrate.

The semiconductor substrate may be any one that is usually used in a semiconductor device without special limitation and illustratively includes elemental semiconductors such as silicon, germanium and compound semiconductors such as GaAs, InGaAs and ZnSe. Among them, the silicon substrate is preferred. On this semiconductor substrate, one or more of device isolation regions, elements such as transistors, capacitors, resistances and the like, circuits made thereof, interlayer insulating films, other semiconductor devices and the like may be formed in a single-layer or multilayer structure. Among them, a semiconductor substrate is preferred on which one or more of elements such as transistors, capacitors, resistances and the like, circuits made thereof, other semiconductor devices and the like are formed in the single-layer.

The wiring formation step in the present invention generally means a sequence of steps comprising forming an interlayer insulating film on an (n)-th layer wiring; forming a hole and/or trench or the like; burying the hole and/or trench with a conductive material; and forming an (n+1)-th layer wiring on the hole and/or trench.

The (n)-th layer wiring means herein, for instance, a substrate in which an impurities-diffused layer is formed, an electrode of an element, circuit or the like as mentioned above formed on a substrate, a wiring formed in a second or upward layer and the like. The substrate in which the impurities diffusion layer is formed may be a substrate in which P type or N type impurities are diffused at a comparatively high concentration. Further, a material for the electrode and wiring, thickness thereof and the like may be those usually use for electrodes and wirings without any particular limitation and illustratively include conductive materials, for example, a single-layer or laminated layer of an amorphous, single crystal or polycrystal N type or P type elemental semiconductor (e.g. silicon, germanium, etc.) or compound semiconductor (e.g. GaAs, InP, ZnSe, CsS, etc.); metals such as gold, platinum, silver, copper, aluminum and the like or their alloy; metals of high melting point such as titanium, tantalum, tungsten and the like; silicide, polycide of a metal of high melting point and the like.

The interlayer insulating film may be one capable of keeping electric isolation between wirings and may be formed in a single layer of a BN film having a dielectric constant of less than 4 or in a laminated film with other insulating film such as a $SiO_2$ film, a FSG film, a hydrogenized sil-sesquioxane resin film, a film containing carbon with a low dielectric constant (e.g., a CVD-SiOC film, etc.) or the like, as far as it is formed of a film containing a BN film and having a dielectric constant of less than 4. Among them, other insulating films are preferably those having almost the same dielectric constant as or a lower dielectric constant than that of the BN film. Further, the dielectric constant of the BN film is below 4, preferably not more than about 3.5, more preferably not more than about 3.0 and further more preferably not more than about 2.0. The thickness of the BN film having a dielectric constant of below 4 can be appropriately adjusted depending upon the material of wiring, the performance of the semiconductor thus obtained, applied voltage for the semiconductor device and the like. In case of a single layer, for example, about 5 to 30 nm thickness may be mentioned. In case of a laminated film, it may be sufficient that the film has a thickness such that it keeps insulation together with other insulating films, but it may be more preferable that the film has a thickness such that it functions as a film to inhibit diffusion of a metal such as copper etc., and/or as a dry etching stop film for formation of the trench wiring in the step of forming a multilayer wiring in the dual damascene structure using copper as wiring material, as described below. For example, in case where said other insulating films have a thickness of about 300 to 500 nm, the BN film may preferably have a thickness of about 5 to 20 nm. When it is used as the film inhibiting diffusion of a metal and/or as the dry etching stop film for formation of the trench wiring, it is preferable to place the BN film at the bottom of the interlayer insulating film.

The BN film having a dielectric constant of less than 4 can be formed by various methods, for example, a chemical vapor deposition (CVD) method, an atmospheric pressure CVD method, a reduced pressure CVD method, a thermal (high, normal, low temperature) CVD method, a plasma CVD method, a photo CVD method, an ECR plasma CVD method and the like. Among them, the plasma CVD method and the low temperature thermal CVD method are preferred.

For example, in case of the plasma CVD method, it is preferable to use $B_2H_6$ and $NH_3$ gases as materials and in addition to these gases, an inert gas such as helium, neon, argon or the like may be used, too. An appropriate volume ratio of $B_2H_6$ and $NH_3$ is 1:about 10 to 50, 1:about 40, 1:about 30, further 1:about 20.

Appropriate conditions of the plasma CVD method is selected so as to obtain a desired dielectric constant, to proceed the deposition smoothly (e.g. deposition rate: not less than about 10 nm/min, preferably not less than about 15 nm/min, etc.), not to induce atomic movement due to fusion of a wiring material in an under layer and not to damage the wiring, substrate and the like in the under layer. For example, preferable conditions are shown as follows: Pressure within a CVD apparatus may be about 0.5 to 3 torr; atmospheric temperature may be not more than about 450° C., preferably about 250 to 350° C.; power may be about 40 to 200 W and the like.

Further, in case of the low temperature thermal CVD method, it is preferable to use TEAB (triethylamine bane complex) and $NH_3$ gases as materials, and in addition to these gases, a carrier gas may be used. An appropriate volume ratio of TEAB and $NH_3$ is 1:about 10 to 50, 1:about 40, 1:about 30 and further 1:about 20. Appropriate conditions of the low temperature thermal CVD method is selected so as to obtain a desired dielectric constant, to proceed the deposition smoothly, not to induce atomic movement due to fusion of a wiring material in an under layer and not to damage the wiring, substrate and the like in the under layer, as described above. For example, preferable conditions are shown as follows: Pressure within a CVD apparatus may be about 1 to 3 torr; atmospheric temperature may be not more than about 450° C., preferably about 350 to 400° C.; power may be about 40 to 200 W and the like.

The holes are generally formed to penetrate the interlayer insulating film for contacting an upward layer with an under layer of the interlayer insulating film. Examples thereof include contact hole, via hole, through hole and the like. The trenches are generally formed for arrangement of wiring in the surface of the interlayer insulating film as concave portions which are not penetrating. There is no particular limitation to size and shape of the holes and trenches as long as they are generally applied to semiconductor devices.

The holes and/or trenches or the like may be formed by conventional methods such as a photolithography and etching technique. The etching can be performed by various methods, e.g., wet etching using an acid such as fluoric acid, hot phosphoric acid, nitric acid, sulfuric acid and the like or an alkaline solution; dry etching, i.e., physical etching such as sputtering or the like, chemical etching such as RIE method or the like. In addition, in case of using the BN film as an etching stop film, it is preferable to choose the conditions of etching so as to increase a selective ratio of the insulating film to the BN film.

The holes or trenches can be buried, for example, by forming a film of a conductive material on the whole surface of the interlayer insulating film including the holes or trenches, for example, by a physical method such as a PVD method, a sputtering method or the like or by a chemical method such as a CVD method or the like and removing a unnecessary part of the conductive material outside the holes or trenches. The conductive material may be selected as required from the above-mentioned wiring materials. Among them, copper or its alloy is preferred. An appropriate thickness thereof is not particularly limited and, for example, may preferably be not less than the total depth of the hole and trench is preferred. Moreover, prior to forming the film of the conductive material, a single layer film or laminated layer of a metal or an alloy such as titanium nitride, silicon tungsten nitride, niobium, tantalum and the like may be formed on the surface of holes and/or trenches. The unnecessary part of the conductive material can be removed by various physical or chemical etching methods, for example, a sputtering, a CVD method, a CMP method and the like. Among them, the CMP method is preferred.

Further, the above-described wiring step of the invention may be performed only once or a plurality of times. Also the wiring step may be performed at least once during a plurality of wiring steps.

The method of manufacturing semiconductor devices of the present invention will be explained below in detail with reference to the drawings.

As shown in FIG. 1(a), on the surface of a silicon substrate 1 in which an element (not shown by drawings) such as a transistor and the like is made, an interlayer insulating film 2 composed of a BPSG film is formed by an atmospheric pressure CVD method. In the predetermined region of this interlayer insulating film 2, a contact hole connecting the silicon substrate 1 is formed by using a photolithography and dry etching technique. On the whole surface of the interlayer insulating film 2 including this contact hole, a tungsten film is formed according to a sputtering method and a CVD method, and the unnecessary part of the tungsten film is removed by CMP method to bury a contact plug 3 into the contact hole.

Figure 1B:
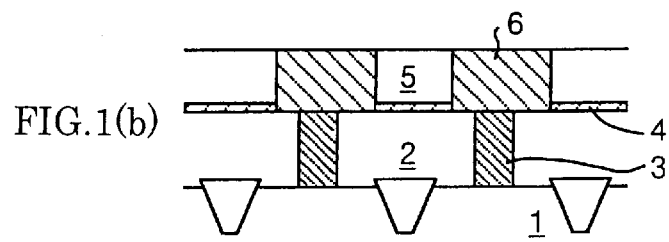

Then, as shown in FIG. 1(b), a boron nitride (BN) film as the trench etching stop film is formed in 50 nm thick by a plasma CVD method at a temperature below 450° C. in plasma atmosphere at not more than 600 W using a mixed gas $B_2H_6$ and $NH_3$=50:1 as source. A non-fluoride organic polymer film 5 in 500 nm thick showing a dielectric constant of 3 is formed thereon by spin coating at 2000 rpm and heating at 200° C. in a nitrogen atmosphere. In the predetermined region of this non-fluoride organic polymer film 5, a wiring trench is formed by the photolithography and dry etching technique. The copper film is formed on the surface of the non-fluoride organic polymer film 5 including the wiring trench by a sputtering method and EP method and the unnecessary part of the copper film is removed by CMP method to bury a first layer copper wiring 6.

Figure 1C:
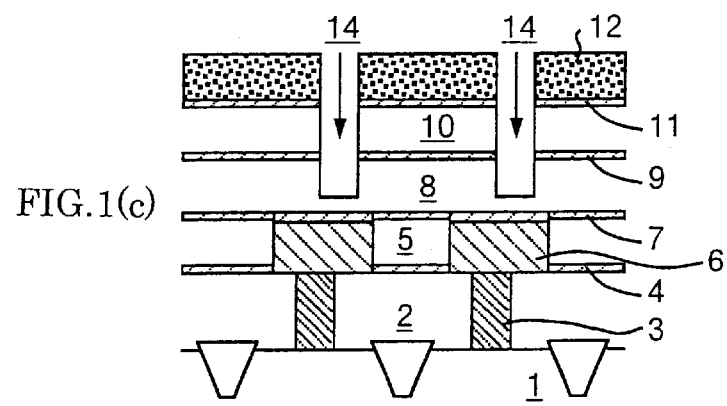

Subsequently, as shown in FIG. 1(c), on the whole surface of the non-fluoride organic polymer film 5 including the first copper wiring 6, a BN film 7 in 50 nm thick is formed as a copper diffusion inhibiting film. A non-fluoride organic polymer film 8 in 500 nm thick is formed thereon by spin coating and then by a thermal treatment method. Then, a BN film 9 in 50 nm thick, a non-fluoride organic polymer film 10 in 450 nm thick and a BN film 11 in 50 nm thick are formed thereon in order. Further, the predetermined shape of a resist mask 12 is formed thereon by the photolithography and dry etching technique. A contact hole 14 connecting the first copper wiring 6 is formed using this resist mask 12.

Figure 1D:
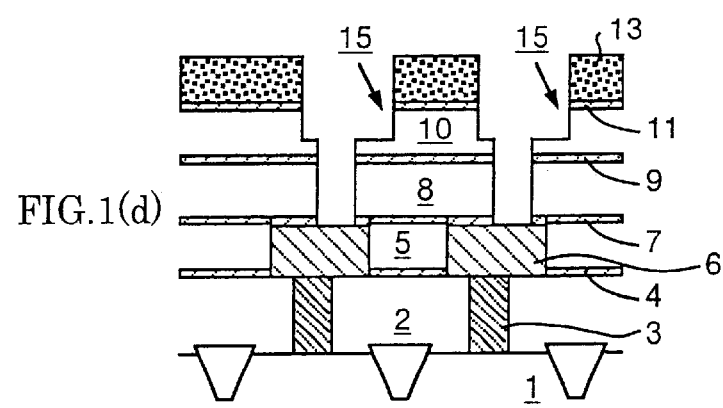

Further, as shown in FIG. 1(d), the predetermined shape of a resist mask 13 is formed by to the photolithography and dry etching technique and then a trench 15 for damascene wiring is formed by using this resist mask 13.

Figure 1E:
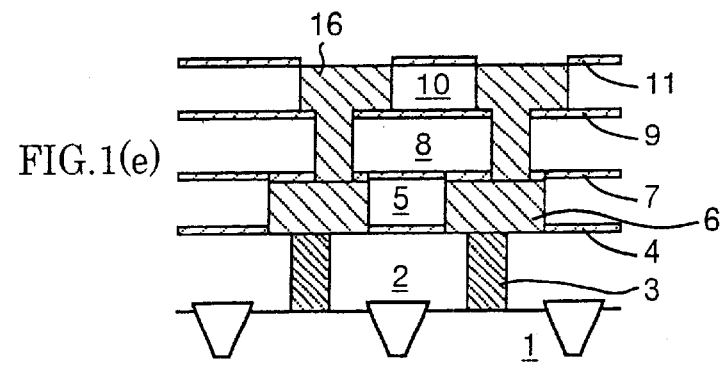

Then, as shown in FIG. 1(e), a copper film is formed on the BN film 11 connecting the contact hole 14 and the trench 15 for damascene wiring by a sputtering method and EP method. The unnecessary part of the copper film is removed by CMP method to bury a second copper wiring 16 into the contact hole 14 and the trench 15, whereby the copper dual damascene laminated wiring is formed.

By the same manufacturing step as described above, the vertical and horizontal wiring capacitance in the copper dual damascene multiplayer wiring were measured in the case where a non-fluoride organic polymer film having a dielectric constant of 3 was used as the interlayer insulating film and a BN film having a dielectric constant of 3 or SiN film having a dielectric constant of 8 was used as the damascene trench processing etching stop film and the copper diffusion inhibiting film.

As the result, a 10% fall of the horizontal wiring capacitance was attained when the BN film was used under the conditions of 0.21 μm of the damascene wiring distance and 0.45 μm of the wiring depth in comparison with the case of using the SiN film.

Further, a 10% fall of the vertical wiring capacitance was attained when the BN film was used under the condition of 0.5 μm of depth of the dual damascene hole in comparison with the case of using the SiN film.

Furthermore, the vertical and horizontal wiring capacitance in the copper dual damascene multiplayer wiring were measured in the case where a non-fluoride organic polymer film having a dielectric constant of 2.7 was used as the interlayer insulating film and a SiN film having a dielectric constant of 8, a BN film having a dielectric constant of 4 formed by a conventional method or a BN film having a dielectric constant of 3 or 2 formed by the manufacturing step described above was formed as the damascene trench processing etching stop film and the copper diffusion inhibiting film.

As the result, supposing that the vertical and the horizontal wiring capacitances of the SiN film having a dielectric constant of 8 are 100%, the BN film having a dielectric constant of 4 showed a 92% and a 95% vertical and horizontal wiring capacitance, respectively, the BN film having a dielectric constant of 3 showed a 88% and a 91%, respectively, and the BN film having a dielectric constant of 2 showed a 85% and a 87%, respectively.

Thus, it has been found that the BN films having a dielectric constant of 3 and 2 can attain about 10% improvement of the operation rate than the conventional BN film having a dielectric constant 4. Further, it has been also seen that, as the dielectric constant is lower, there is less influence of unevenness of the thickness of the interlayer insulating film on the capacitance.

According to the present invention, it has become possible to form a device which can inhibit the increase of the vertical and horizontal wiring capacitance which would induce the wiring delay, by forming the interlayer insulating film composed of the boron nitride film having a dielectric constant of less than 4 in the step of forming the wiring. Thus, a high-speed device can be manufactured by a simple method.

Since the interlayer insulating film of the present invention can exhibit the functions of the copper diffusion inhibition and/or the dry etching stopper for forming the trench wiring in the step of the multilayer wiring formation in the dual damascene structure using copper as a wiring material, it will be possible to effectively utilize the characteristics due to the low dielectric constant while keeping these functions. Therefore, of the vertical and horizontal wiring capacitance can be reduced, which leads to the realization of a high-speed device.

What is claimed is:

1. A method of manufacturing a semiconductor device, the method comprising:

forming an interlayer insulating film of boron nitride having a dielectric constant of not more than about 2.0 on an (n)-th layer wiring, forming a hole and/or a trench in the interlayer insulating film, burying the hole and/or trench with a conductive material, and forming an (n+1)-th layer wiring on the hole and/or trench.

2. The method according to claim 1, wherein the semiconductor device has a multilayer wiring of copper of dual damascene structure and the boron nitride film is formed as a copper diffusion inhibiting film and/or an etching stop film for wiring formation.

3. The method according to claim 1, wherein the boron nitride film is formed by a plasma CVD method using $B_2H_6$ and $NH_3$ as materials.

4. The method according to claim 1, wherein the boron nitride film is formed by a thermal CVD method using TEAB and $NH_3$ as materials.

5. The method according to claim 1, wherein the (n)-th layer wiring is a substrate having an impurities diffused layer formed therein, an electrode formed on a substrate or a wiring formed as a second or upward layer.

6. The method according to claim 1, wherein the interlayer insulating film is a laminated film of a BN film having a dielectric constant of less than 4 and another insulating film having substantially the same dielectric constant as or a lower dielectric constant than that of the BN film.

7. The method according to claim 6, wherein the BN film having a dielectric constant of less than 4 is placed at the bottom of the interlayer insulating film.

8. The method according to claim 1, wherein the wiring formation step is performed a plurality of times.

9. The method of claim 1, wherein the interlayer insulating film consists essentially of boron nitride having a dielectric constant of not more than about 2.0.

10. A method of making a semiconductor device, the method comprising:

forming a first wiring;

depositing at least an insulating film over the first wiring, wherein the insulating film consists essentially of boron nitride and has a dielectric constant of not more than about 2.0;

forming a contact hole and/or trench in the insulating film; and forming a second wiring in the contact hole and/or trench so that the first and second wirings are in electrical communication with one another.

11. A method of manufacturing a semiconductor device, the method comprising:

forming an interlayer insulating film consisting essentially of boron nitride having a dielectric constant of not more than about 2.0 on an (n)-th layer wiring, forming a hole and/or a trench in the interlayer insulating film, burying the hole and/or trench with a conductive material, and forming an (n+1)-th layer wiring on the hole and/or trench.

* * * * *